(12) United States Patent
Zhou et al.

(10) Patent No.: US 10,978,517 B2
(45) Date of Patent: Apr. 13, 2021

(54) DISPLAY SUBSTRATE HAVING A FILTER CONVERSION LAYER

(71) Applicant: BOE TECHNOLOGY GROUP CO., LTD., Beijing (CN)

(72) Inventors: Qingchao Zhou, Beijing (CN); Qing Wang, Beijing (CN); Shengji Yang, Beijing (CN); Xiaochuan Chen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 67 days.

(21) Appl. No.: 16/457,876

(22) Filed: Jun. 28, 2019

(65) Prior Publication Data

US 2020/0035755 A1 Jan. 30, 2020

(30) Foreign Application Priority Data

Jul. 25, 2018 (CN) .......................... 201810832092.8

(51) Int. Cl.
*H01L 27/32* (2006.01)
*H01L 51/00* (2006.01)
(Continued)

(52) U.S. Cl.
CPC ............ *H01L 27/322* (2013.01); *G06F 3/011* (2013.01); *H01L 27/3213* (2013.01);
(Continued)

(58) Field of Classification Search
CPC ............... H01L 27/322; H01L 27/3213; H01L 27/3241; H01L 51/0032; H01L 51/5262; H01L 33/50; H01L 33/501; H01L 33/502; H01L 33/508; H01L 2933/0041; G06F 3/011

See application file for complete search history.

(56) References Cited

U.S. PATENT DOCUMENTS 8,982,446 B2 * 3/2015 Ray .................. G02B 26/007
345/107
10,357,582 B1 * 7/2019 Barron .................. A61L 2/084
(Continued)

FOREIGN PATENT DOCUMENTS

| CN | 103235442 A | 8/2013 |
| CN | 203337949 U | 12/2013 |

(Continued)

OTHER PUBLICATIONS

First Office Action issued in corresponding Chinese Application No. 201810832092.8, dated Sep. 30, 2019, with English translation.

*Primary Examiner* — Ida M Soward
(74) *Attorney, Agent, or Firm* — McDermott Will & Emery LLP

(57) ABSTRACT

A display substrate includes a base substrate and a filter conversion layer disposed on the base substrate. The filter conversion layer includes a light conversion material capable of absorbing light with a wavelength less than a preset wavelength range, and converting the absorbed light into light with a wavelength in the preset wavelength range. The filter conversion layer is configured to allow the light with the wavelength in the preset wavelength range to pass through.

19 Claims, 4 Drawing Sheets

(51) Int. Cl.
   *H01L 51/52* (2006.01)
   *H01L 33/50* (2010.01)
   *G06F 3/01* (2006.01)
(52) U.S. Cl.
   CPC ...... *H01L 27/3241* (2013.01); *H01L 51/0032* (2013.01); *H01L 51/5262* (2013.01); *H01L 33/50* (2013.01); *H01L 33/501* (2013.01); *H01L 33/502* (2013.01); *H01L 33/508* (2013.01)

(56) References Cited

U.S. PATENT DOCUMENTS

| | | | | |
|---|---|---|---|---|
| 10,490,711 | B2* | 11/2019 | Yamamoto | G02B 6/005 |
| 10,781,369 | B2* | 9/2020 | Yonemoto | C09D 133/08 |
| 2012/0255609 | A1* | 10/2012 | Sobue | H01L 31/055 |
| | | | | 136/257 |
| 2013/0126743 | A1* | 5/2013 | Iwakiri | A61B 6/4216 |
| | | | | 250/366 |
| 2013/0240829 | A1* | 9/2013 | Kuramachi | H01L 21/02601 |
| | | | | 257/9 |
| 2013/0265552 | A1* | 10/2013 | Yoo | H04N 9/3197 |
| | | | | 353/31 |
| 2013/0340808 | A1* | 12/2013 | Komatsu | H05B 33/04 |
| | | | | 136/247 |
| 2015/0309359 | A1 | 10/2015 | Wu et al. | |
| 2016/0003448 | A1 | 1/2016 | Dong et al. | |
| 2016/0349573 | A1* | 12/2016 | Ohmuro | G02B 5/305 |
| 2017/0255054 | A1 | 9/2017 | Li | |
| 2018/0156961 | A1* | 6/2018 | Miki | G02F 1/133512 |
| 2018/0301513 | A1 | 10/2018 | Li | |
| 2018/0364525 | A1* | 12/2018 | Murata | G02B 6/0026 |
| 2019/0113186 | A1* | 4/2019 | Yoon | G02F 1/133606 |

FOREIGN PATENT DOCUMENTS

| | | |
|---|---|---|
| CN | 105353554 A | 2/2016 |
| CN | 106910836 A | 6/2017 |

* cited by examiner

DISPLAY SUBSTRATE HAVING A FILTER CONVERSION LAYER

CROSS-REFERENCE TO RELATED APPLICATION

This application claims priority to Chinese Patent Application No. 201810832092.8, filed with the Chinese Patent Office on Jul. 25, 2018, titled "COLOR FILM SUBSTRATE AND WOLED DISPLAY APPARATUS", which is incorporated herein by reference in its entirety.

TECHNICAL FIELD

The present disclosure relates to the field of display technologies, and in particular, to a display substrate and a display apparatus.

BACKGROUND

In recent years, the silicon-based organic light-emitting diode (OLED) microdisplay has been widely used in the field of virtual reality (VR) and augmented reality (AR) technologies as a near-eye display.

SUMMARY

In one aspect, a display substrate is provided, including a base substrate and a filter conversion layer disposed on the base substrate. The filter conversion layer includes a light conversion material capable of absorbing light with a wavelength less than a preset wavelength range and converting the absorbed light into light with a wavelength in the preset wavelength range. The filter conversion layer is configured to allow the light with the wavelength in the preset wavelength range to pass through.

In some embodiments, stokes shift of the light conversion material is less than or equal to 20 nm.

In some embodiments, the light conversion material includes a perovskite quantum dot material.

In some embodiments, a general formula of the perovskite quantum dot material is $APbX_3$. A is Cs or $CH_3NH_3$, and $X_3$ is selected from a group consisting of $Br_3$, $Br_NI_{3-N}$ and $Br_NCl_{3-N}$. N is greater than or equal to 0 and less than 3.

In some embodiments, a particle diameter of the perovskite quantum dot material is in a range from 2.5 nm to 5 nm.

In some embodiments, the filter conversion layer further includes an optical filter material configured to allow light with a wavelength in a preset color wavelength range to pass through. The light conversion material is mixed in the optical filter material.

In some embodiments, a mass ratio of the light conversion material to the optical filter material is in a range from approximately 2% to approximately 5%.

In some embodiments, the optical conversion layer includes red filter conversion films, green filter conversion films and blue filter conversion films. The preset wavelength range includes a red preset wavelength range, a green preset wavelength range, and a blue preset wavelength range. The light conversion material includes a first light conversion material distributed in red filter conversion films, a second light conversion material distributed in the green filter conversion films, and a third light conversion material distributed in the blue filter conversion films. The first light conversion material is configured to absorb light with a wavelength less than the red preset wavelength range and convert the absorbed light into light with a wavelength in the red preset wavelength range. The second light conversion material is configured to absorb light with a wavelength less than the green preset wavelength range and convert the absorbed light into light with a wavelength in the green preset wavelength range. The third light conversion material is configured to absorb light with a wavelength less than the blue preset wavelength range and convert the absorbed light into light with a wavelength in the blue preset wavelength range.

In some embodiments, the red preset wavelength range is from 620 nm to 640 nm, the green preset wavelength range is from 520 nm to 540 nm, and the blue preset wavelength range is from 450 nm to 470 nm.

In some embodiments, the first light conversion material includes a $CsPbBr_NI_{3-N}$ perovskite quantum dot material and/or a $CH_3NH_3PbBr_NI_{3-N}$ perovskite quantum dot material. The second light conversion material includes a $CsPbBr_3$ perovskite quantum dot material and/or a $CH_3NH_3PbBr_3$ perovskite quantum dot material. The third light conversion material includes a $CsPbBr_NCl_{3-N}$ perovskite quantum dot material and/or a $CH_3NH_3PbBr_NCl_{3-N}$ perovskite quantum dot material. N is greater than or equal to 0 and less than 3.

In some embodiments, a molar mass ratio of Br and I in the first light conversion material is inversely related to a wavelength of converted light of the first light conversion material. A particle diameter of the second light conversion material is positively related to a wavelength of converted light of the second light conversion material. A molar mass ratio of Br and Cl in the third light conversion material is positively related to a wavelength of converted light of the third light conversion material.

In some embodiments, the filter conversion layer includes an optical filter film configured to allow light with a wavelength in a preset color wavelength range to pass through, and a light conversion film disposed on a side of the optical filter film proximate to or away from the base substrate. Material for manufacturing the light conversion film is the light conversion material.

In some embodiments, a thickness of the light conversion film is in a range from 0.5 μm to 2 μm.

In some embodiments, the optical filter film includes red filter sub-films, green filter sub-films and blue filter sub-films. The preset wavelength range includes a red preset wavelength range, a green preset wavelength range, and a blue preset wavelength range. The light conversion film includes red light conversion sub-films, green light conversion sub-films and blue light conversion sub-films. Each red light conversion sub-film is disposed on a side of a corresponding red filter sub-film proximate to or away from the base substrate, and material for manufacturing the red light conversion sub-films is a first light conversion material, which is configured to absorb light with a wavelength less than the red preset wavelength range and convert the absorbed light into light with a wavelength in the red preset wavelength range. Each green light conversion sub-film is disposed on a side of a corresponding green filter sub-film proximate to or away from the base substrate, and material for manufacturing the green light conversion sub-films is a second light conversion material, which is configured to absorb light with a wavelength less than the green preset wavelength range and convert the absorbed light into light with a wavelength in the green preset wavelength range. Each blue light conversion sub-film is disposed on a side of a corresponding blue filter sub-film proximate to or away from the base substrate, and material for manufacturing the blue light conversion sub-films is a third light conversion material, which is configured to absorb light with a wavelength less than the blue preset wavelength range and convert the absorbed light into light with a wavelength in the blue preset wavelength range.

In some embodiments, the red preset wavelength range is from 620 nm to 640 nm, the green preset wavelength range is from 520 nm to 540 nm, and the blue preset wavelength range is from 450 nm to 470 nm.

In some embodiments, the first light conversion material includes a $CsPbBr_NI_{3-N}$ perovskite quantum dot material and/or a $CH_3NH_3PbBr_NI_{3-N}$ perovskite quantum dot material. The second light conversion material includes a $CsPbBr_3$ perovskite quantum dot material and/or a $CH_3NH_3PbBr_3$ perovskite quantum dot material. The third light conversion material includes a $CsPbBr_NCl_{3-N}$ perovskite quantum dot material and/or a $CH_3NH_3PbBr_NCl_{3-N}$ perovskite quantum dot material. N is greater than or equal to 0 and less than 3.

In some embodiments, a molar mass ratio of Br and I in the first light conversion material is inversely related to a wavelength of converted light of the first light conversion material. A particle diameter of the second light conversion material is positively related to a wavelength of converted light of the second light conversion material. A molar mass ratio of Br and Cl in the third light conversion material is positively related to a wavelength of converted light of the third light conversion material.

In some embodiments, the display substrate further includes white organic light emitting diode (WOLED) devices disposed between the base substrate and the filter conversion layer. Each WOLED device includes an anode, a microcavity adjustment layer, an organic light emitting layer and a cathode.

In another aspect, a display apparatus is provided, including the display substrates described above.

DETAILED DESCRIPTION

The technical solutions in some embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

The silicon-based OLED microdisplay can be used in a wide range of temperature, and with the maturity of the complementary metal oxide semiconductor (CMOS) technology, the silicon-based OLED microdisplay can achieve ultra-high pixel display.

However, at present, low brightness of the silicon-based OLED microdisplay limits its application in VR, AR and mixed reality (MR) technologies, so the development of a high-brightness silicon-based OLED microdisplay is one of the main tendencies.

In the related art, the brightness of the silicon-based OLED microdisplay is enhanced by using the strong microcavity effect, that is, light is reinforced in the microcavity due to interference. However, this causes a blue shift in the position of the emission peak of the light. Then, after the light passes through the optical filter film, the blue shift of the wavelength of the light due to the strong microcavity effect is directly translated into a deviation in a chromaticity coordinate, which leads to a more serious visual color cast problem, affecting the display effect of the OLED microdisplay seriously.

Figure 1:
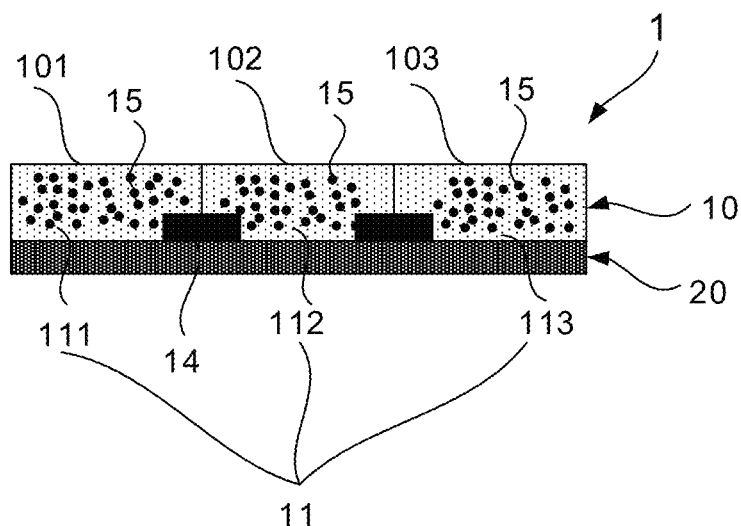
FIG. 1 is a schematic structural diagram of a display substrate, in accordance with some embodiments.
Figure 2:
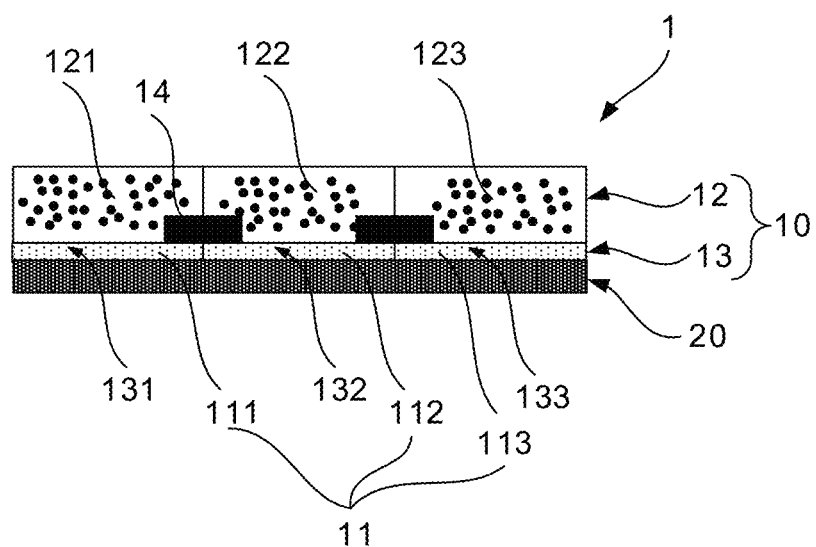
FIG. 2 is a schematic structural diagram of another display substrate, in accordance with some embodiments.

Referring to FIG. 1 and FIG. 2, some embodiments of the present disclosure provide a display substrate 1, and the display substrate 1 includes a base substrate 20 and a filter conversion layer 10 disposed on the base substrate 20. The filter conversion layer 10 includes a light conversion material 11, and the light conversion material 11 is capable of absorbing light with a wavelength less than a preset wavelength range and converting the absorbed light into light with a wavelength in the preset wavelength range. The filter conversion layer 10 is configured to allow light with the wavelength in the preset wavelength range to pass through.

The light conversion material 11 is a material which, after being irradiated by light with a wavelength, emits light with a new wavelength. Here, the specific type of the light conversion material 11 is not limited, as long as the light conversion material 11 can absorb light with a wavelength less than the preset wavelength range and convert the absorbed light into light with a wavelength in the preset wavelength range.

Regarding the preset wavelength range, those skilled in the art may set it according to the wavelength of the light to be obtained after conversion, and then a suitable light conversion material 11 may be selected according to the wavelength of the light to be absorbed and the preset wavelength range.

Since the light conversion material 11 in the filter conversion layer 10 may absorb light with a wavelength less than the preset wavelength range and convert the absorbed light into light with a wavelength in the preset wavelength range, the emission spectrum, which moves toward the short wavelength with the increase of the viewing angle, may be corrected to the position of the emission peak corresponding to the front viewing angle as much as possible. In this way, the visual color cast due to strong microcavity effect may be reduced and the display effect of the display substrate is improved.

In some examples, the base substrate 20 is a silicon-based base substrate. In some other examples, the base substrate 20 is a base substrate made of other materials, such as a glass base substrate. In addition, the base substrate 20 may include driving circuit structures, and each driving circuit structure is configured to drive a corresponding light emitting device (such as a white OLED (WOLED) device 30, as shown in FIG. 3) in the display substrate 1 to emit light.

Figure 3:
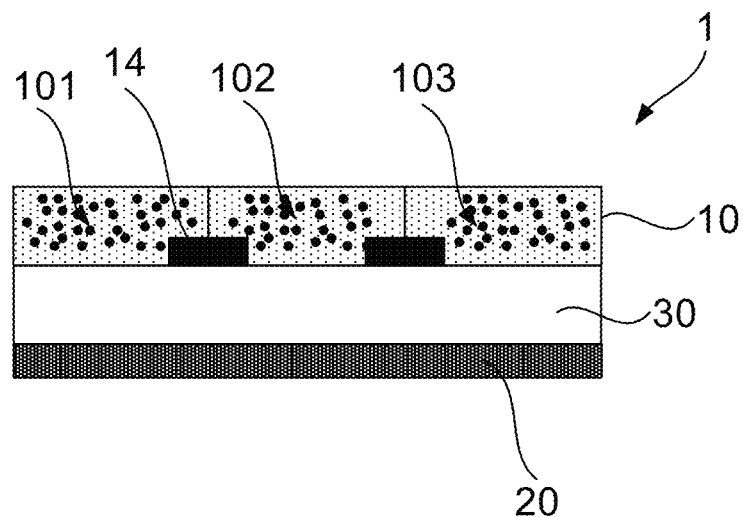
FIG. 3 is a schematic structural diagram of yet another display substrate, in accordance with some embodiments.
Figure 4:
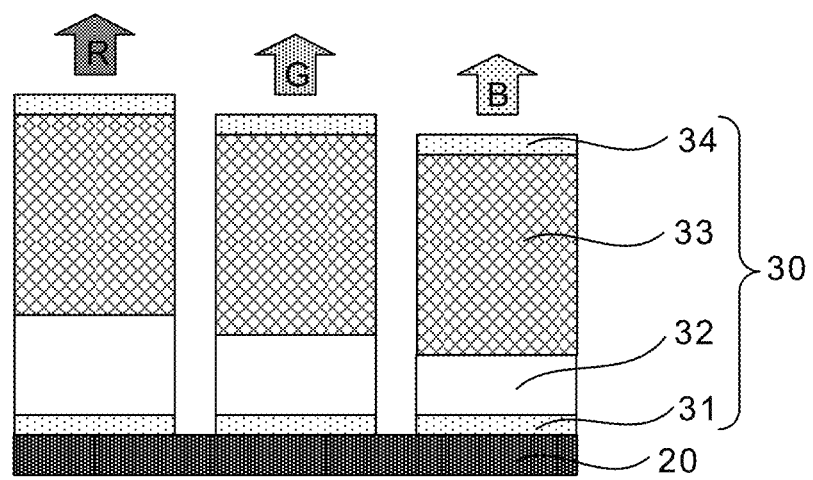
FIG. 4 is a schematic structural diagram of yet another display substrate, in accordance with some embodiments.

Referring to FIG. 3 and FIG. 4, the display substrate 1 further includes WOLED devices 30 disposed between the base substrate 20 and the filter conversion layer 10. Each WOLED device 30 includes an anode 31 and a microcavity adjustment layer 32, an organic light-emitting layer 33 and a cathode 34.

As shown in FIG. 4, thicknesses of three microcavity adjustment layers 32 corresponding to three sub-pixels of R, G, and B are different, and thus the microcavity resonance periods of the three microcavity adjustment layers 32 are different. The strong microcavity effect can be utilized to enhance the luminous intensity of the three sub-pixels of R, G and B, and the luminous intensities of the three sub-pixels of R, G and B may achieve their respective required luminous intensities.

Figure 5:
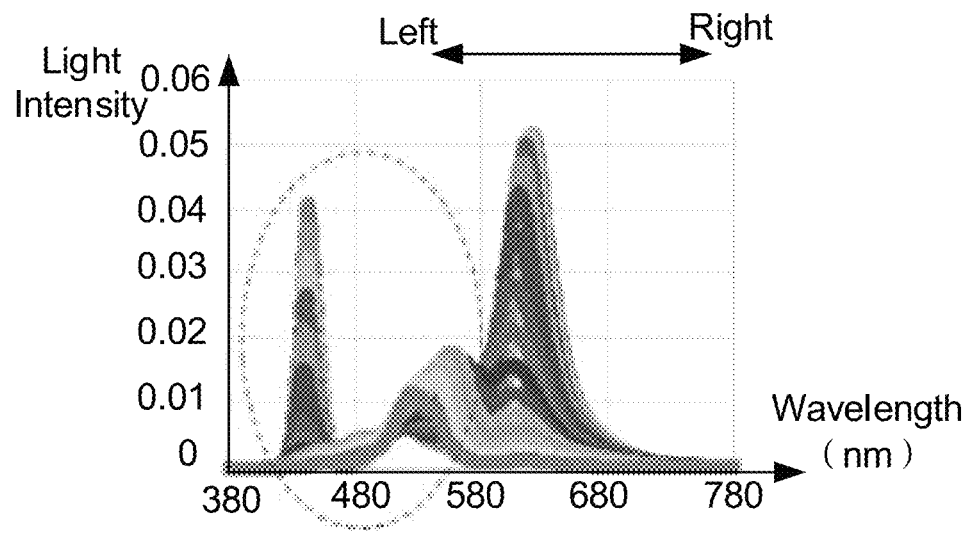
FIG. 5 is a schematic diagram showing spectral curves of a light emitting device in different viewing angles under strong microcavity effect.

If the display substrate 1 does not include the filter conversion layer 10, this microcavity structure may make the visual color cast problem more serious. For example, taking red light as an example, a wavelength of the red light is in a range from 620 nm to 640 nm. Due to the strong microcavity effect, as the viewing angle increases, the position of the emission peak of the red light will be blue-shifted, that is, red light with a wavelength in a range from 600 nm to 620 nm will be generated. FIG. 5 shows the spectra of red light at different viewing angles. Each curve in the figure corresponds to a different viewing angle. Light corresponding to the short-wavelength spectra marked by the dotted circle is stray light, which can be filtered by the red filter film, and thus the stray light will not have a big influence on the visual color cast of the display substrate. However, the wavelengths of the luminosity curve on the right of the dotted circle are basically located in the permeable range of the red filter film. After light with these wavelengths passes through the filter film, the blue shift of the wavelength due to the strong microcavity effect may be directly translated into the deviation in the chromaticity coordinates.

However, in the embodiments of the present disclosure, the red light with a wavelength in the wavelength range from 600 nm to 620 nm is absorbed by the light conversion material 11 in the filter conversion layer 10, and the absorbed light is converted into red light with a wavelength in the wavelength range from 620 nm to 640 nm. Therefore, the blue shift of the spectrum due to the strong microcavity effect may be corrected. Moreover, since the light with short-wavelengths far from the emission peak may be directly filtered by the optical filter film, the light conversion material 11 is not required to absorb the light with short-wavelengths. In this case, the light conversion material 11 only needs to absorb and convert the short-wavelength light proximate to the emission peak. Therefore, in some embodiments, the light conversion material 11 having stokes shift less than or equal to 20 nm is selected to meet the requirements of light conversion.

In some embodiments, the light conversion material 11 includes a perovskite quantum dot material. For example, the general formula of the perovskite quantum dot material is $APbX_3$. Pb is plumbum, A is caesium (Cs) or $CH_3NH_3$, and $X_3$ is selected from a group consisting of $Br_a$, $Br_N I_{3-N}$ and $Br_N Cl_{3-N}$. N is greater than or equal to 0 and less than 3. In this way, the light conversion material 11 is allowed to have a conversion effect from high energy to low energy.

Figure 6:
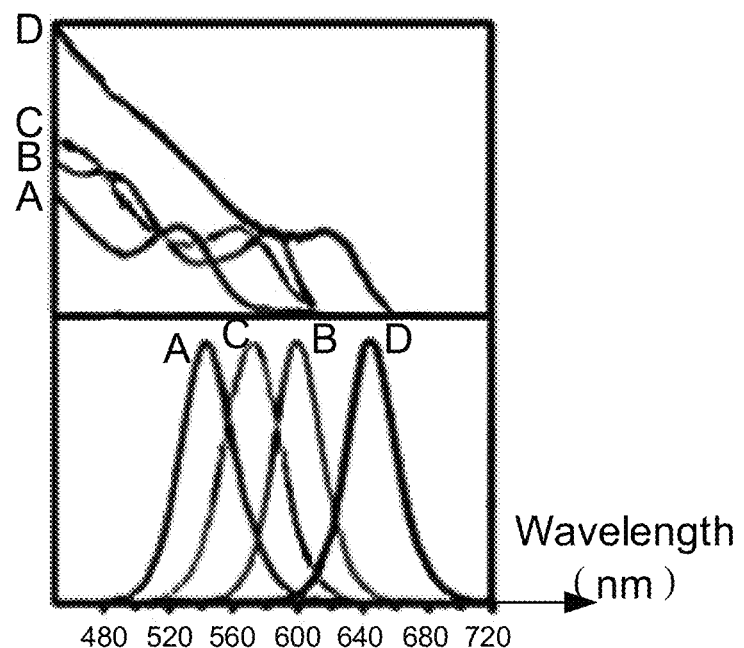
FIG. 6 is a schematic diagram showing absorption and emission spectra of a light conversion material, in accordance with some embodiments.

As shown in FIG. 6, taking light of four colors A, B, C, and D as an example, the upper portion of the figure shows the absorption spectra of the light conversion material 11, and the lower portion shows the emission spectra of the light conversion material 11. As can be seen from FIG. 6, the light conversion material 11 has a conversion effect from high energy to low energy, that is, the light conversion material 11 may absorb light with short-wavelengths and convert the light into light with long-wavelengths. In addition, disordered light waves may be converted into neat light waves, so that it is not easy to cause chromatic aberration after the light of four colors A, B, C, and D are converted. Therefore, the emission spectrum, which moves toward the short wavelength with the increase of the viewing angle, may be corrected to the position of the emission peak of the front viewing angle as much as possible. In this way, the visual color cast due to the strong microcavity effect is reduced and the display effect of the display substrate is improved.

There are a plurality of ways to provide the filter conversion layer 10 including the light conversion material 11, including but not limited to the embodiments shown below.

In some embodiments, referring to FIG. 1, the filter conversion layer 10 includes an optical filter material 15 and the light conversion material 11. The optical filter material 15 is configured to allow light with a wavelength in a preset color wavelength range to pass through, and the light conversion material 11 is mixed in the optical filter material 15.

The optical filter material 15 is not limited herein, which can be selected by those skilled in the art from existing filter materials according to the needed wavelengths.

In addition, a mass ratio of the light conversion material 11 to the optical filter material 15 is not limited, which can be set by those skilled in the art according to actual conditions. In some embodiments, the mass ratio of the light conversion material 11 to the optical filter material 15 is in a range from approximately 2% to approximately 5%, which may better meet the requirements of light conversion.

In some embodiments, referring again to FIG. 1, the filter conversion layer 10 includes red filter conversion films 101, green filter conversion films 102, and blue filter conversion films 103. Each red filter conversion film 101 allows red light to pass through, each green filter conversion film 102 allows green light to pass through, and each blue filter conversion film 103 allows blue light to pass through.

The preset wavelength range includes a red preset wavelength range, a green preset wavelength range, and a blue preset wavelength range. The light conversion material 11 includes a first light conversion material 111, a second light conversion material 112, and a third light conversion material 113.

The first light conversion material 111 is distributed in the red filter conversion films 101, and is configured to absorb light with a wavelength less than the red preset wavelength range, and convert the absorbed light into light with a wavelength in the red preset wavelength range.

In some embodiments, the first light conversion material 111 distributed in the red filter conversion films 101 includes a $CsPbBr_N I_{3-N}$ perovskite quantum dot material. In some other embodiments, the first light conversion material 111 distributed in the red filter conversion films 101 includes a $CH_3NH_3PbBr_N I_{3-N}$ perovskite quantum dot material. In some other embodiments, the first light conversion material 111 distributed in the red filter conversion films 101 includes the $CsPbBr_N I_{3-N}$ perovskite quantum dot material and the $CH_3NH_3PbBr_N I_{3-N}$ perovskite quantum dot material.

The red preset wavelength range is from 620 nm to 640 nm, that is, the emission peak of the first light conversion material 111 is between 620 nm and 640 nm, and the first light conversion material 111 can absorb light with a wavelength less than 620 nm and convert the absorbed light into light with a wavelength in a range from 620 nm to 640 nm.

In some embodiments, a molar mass ratio of Br and I in the first light conversion material 111 is inversely related to a wavelength of the converted light. Therefore, the wavelength of the light emitted from the first light conversion material 111 can be adjusted by adjusting the molar mass ratio of Br and I. For example, the molar mass ratio of Br and I is decreased to increase the wavelength of the light emitted from the light conversion material 11. For another example, the molar mass ratio of Br and I is increased to reduce the wavelength of the light emitted from the light conversion material 11. For example, in a case where the first light conversion material 111 is the $CH_3NH_3PbBr_NI_{3-N}$ perovskite quantum dot material, and N=0.8, that is, in a case where the first light conversion material 111 is $CH_3NH_3PbBr_{0.8}I_{2.2}$, the wavelength of the converted light emitted from the first light conversion material 111 is 628 nm.

The second light conversion material 112 is distributed in the green filter conversion films 102, and the second light conversion material 112 is configured to absorb light with a wavelength less than the green preset wavelength range, and convert the absorbed light into light with a wavelength in the green preset wavelength range.

In some embodiments, the second light conversion material 112 distributed in the green filter conversion films 102 includes a $CsPbBr_3$ perovskite quantum dot material. In some other embodiments, the second light conversion material 112 distributed in the green filter conversion films 102 includes a $CH_3NH_3PbBr_3$ perovskite quantum dot material. In some other embodiments, the second light conversion material 112 distributed in the green filter conversion films 102 includes the $CsPbBr_3$ perovskite quantum dot material and the $CH_3NH_3PbBr_3$ perovskite quantum dot material.

In some embodiments, the green preset wavelength range is from 520 nm to 540 nm. That is, the emission peak of the second light conversion material 112 is between 520 nm and 540 nm, and the second light conversion material 112 can absorb light with a wavelength less than 520 nm and convert the absorbed light into light with a wavelength in the range from 520 nm to 540 nm.

In some embodiments, a particle diameter of the second light conversion material 112 is positively related to a wavelength of the converted light. Therefore, the wavelength of the light emitted from the second light conversion material 112 can be adjusted by adjusting the particle diameter of the quantum dot material. For example, the particle diameter of the perovskite quantum dot material is increased to increase the wavelength of the converted light emitted from the second light conversion material 112. For another example, the particle diameter of the perovskite quantum dot material is decreased to reduce the wavelength of the converted light emitted from the second light conversion material 112. For example, in a case where the second light conversion material 112 is the $CH_3NH_3PbBr_3$ perovskite quantum dot material and the particle diameter is 4 nm, the wavelength of the converted light emitted from the second light conversion material 112 is 525 nm.

In some embodiments, the third light conversion material 113 is distributed in the blue filter conversion films 103, and the third light conversion material 113 is configured to absorb light with a wavelength less than the blue preset wavelength range, and convert the absorbed light into light with a wavelength in the blue preset wavelength range.

In some embodiments, the third light conversion material 113 distributed in the blue filter conversion films 103 includes a $CsPbBr_NCl_{3-N}$ perovskite quantum dot material. In some other embodiments, the third light conversion material 113 distributed in the blue filter conversion films 103 includes a $CH_3NH_3PbBr_NCl_{3-N}$ perovskite quantum dot material. In some other embodiments, the third light conversion material 113 distributed in the blue filter conversion films 103 includes the $CsPbBr_NCl_{3-N}$ perovskite quantum dot material and the $CH_3NH_3PbBr_NCl_{3-N}$ perovskite quantum dot material.

In some embodiments, the blue preset wavelength range is from 450 nm to 470 nm. That is, the emission peak of the third light conversion material 113 is between 450 nm and 470 nm, and the third light conversion material 113 can absorb light with a wavelength less than 450 nm and convert the absorbed light into light with a wavelength in a range from 450 nm to 470 nm.

In some embodiments, a molar mass ratio of Br and Cl in the third light conversion material is positively related to a wavelength of the converted light. That is, the emission wavelength of the third light conversion material 113 can be adjusted by adjusting the molar mass ratio of Br and Cl. For example, the molar mass ratio of Br and Cl is increased to increase the wavelength of the converted light emitted from the third light conversion material 113. For another example, the molar mass ratio of Br and Cl is decreased to reduce the wavelength of the converted light emitted from the third light conversion material 113. For example, In a case where the third light conversion material 113 is the $CH_3NH_3PbBr_NCl_{3-N}$ perovskite quantum dot material, and N=2.4, that is, in a case where the third light conversion material 113 is a $CH_3NH_3PbBr_{2.4}Cl_{0.6}$ perovskite quantum dot material, the wavelength of the converted light emitted from the third light conversion material 113 is 465 nm.

In the above embodiments, N is greater than or equal to 0 and less than 3.

In some examples, a particle diameter of the above perovskite quantum dot material is in a range from 2.5 nm to 5 nm.

In some other embodiments, referring to FIG. 2, the filter conversion layer 10 includes an optical filter film 12 and a light conversion film 13. The optical filter film 12 is configured to allow light with a wavelength in the preset color wavelength range to pass through, and the light conversion film 13 is disposed on a side of the optical filter film 12 proximate to or away from the base substrate 20 (FIG. 2 shows a case where the light conversion film 13 is disposed on a side of the optical filter film 12 proximate to the base substrate 20). The light conversion film 13 is made of the light conversion material 11.

Here, a thickness of the light conversion film 13 is not limited, which can be set by those skilled in the art according to actual conditions. In some embodiments, the thickness of the light conversion film 13 is in a range from 0.5 μm to 2 μm, which may better meet the requirements of light conversion.

For example, as shown in FIG. 2, the optical filter film 12 includes red filter sub-films 121, green filter sub-films 122, and blue filter sub-films 123. Each red filter sub-film 121 allows red light to pass through, each green filter sub-film 122 allows green light to pass through, and each blue filter sub-film 123 allows blue light to pass through.

The preset wavelength range includes the red preset wavelength range, the green preset wavelength range, and the blue preset wavelength range. The light conversion film 13 includes red light conversion sub-films 131, green light conversion sub-films 132, and blue light conversion sub-films 133.

Each red light conversion sub-films 131 is disposed on a side of a corresponding second red filter sub-film 121 proximate to or away from the base substrate 20 (FIG. 2 shows a case where the red light conversion sub-film 131 is disposed on a side of the second red filter sub-film 121 proximate to the base substrate 20). Material for manufacturing the red light conversion sub-films 131 is the first light conversion material 111, and the first light conversion material 111 is configured to absorb light with a wavelength less than the red preset wavelength range, and convert the absorbed light into light with a wavelength in the red preset wavelength range.

In some embodiments, as shown in FIG. 2, each red light conversion sub-film 131 is disposed on a light incident side of a corresponding second red filter sub-film 121, that is, each red light conversion sub-film 131 is disposed on a side of a corresponding red filter film 121 proximate to the base substrate 20. In this way, after light is converted by the red light conversion sub-film 131, the second red filter sub-film 121 may filter the converted light, so that when a conversion error occurs and variegated light is generated, the variegated light may be effectively filtered.

In some embodiments, the material of the red light conversion sub-films 131 (i.e., the first light conversion material 111) includes a $CsPbBr_NI_{3-N}$ perovskite quantum dot material. In some other embodiments, the material of the red light conversion sub-films 131 (i.e., the first light conversion material 111) includes a $CH_3NH_3PbBr_NI_{3-N}$ perovskite quantum dot material. In some embodiments, the material of the red light conversion sub-films 131 (i.e., the first light conversion material 111) includes the $CsPbBr_NI_{3-N}$ perovskite quantum dot material and the $CH_3NH_3PbBr_NI_{3-N}$ perovskite quantum dot material.

The red preset wavelength range is from 620 nm to 640 nm, that is, the emission peak of the first light conversion material 111 is between 620 nm and 640 nm, and the first light conversion material 111 can absorb light with a wavelength less than 620 nm and convert the absorbed light to light with a wavelength in a range of 620 nm to 640 nm.

In some embodiments, the molar mass ratio of Br and I in the first light conversion material 111 is inversely related to a wavelength of the converted light. Therefore, the wavelength of the light emitted from the first light conversion material 111 can be adjusted by adjusting the molar mass ratio of Br and I. For example, the molar mass ratio of Br and I is decreased to increase the wavelength of light emitted from the first light conversion material 111. For another example, the molar mass ratio of Br and I is increased to reduce the wavelength of light emitted from the first light conversion material 111. For example, in a case where the first light conversion material 111 is a $CH_3NH_3PbBr_NI_{3-N}$ perovskite quantum dot material, and N=0.8, that is, in a case where the first light conversion material 111 is $CH_3NH_3PbBr_{0.8}I_{2.2}$, the wavelength of the converted light of the first light conversion material 111 is 628 nm.

Each green light conversion sub-films 132 is disposed on a side of a corresponding second green filter sub-films 122 proximate to or away from the base substrate 20 (FIG. 2 shows a case where the green light conversion sub-film 132 is disposed on a side of the second green filter sub-films 122 proximate to the base substrate 20). Material for manufacturing the green light conversion sub-films 132 is the second light conversion material 112, and the second light conversion material 112 is configured to absorb light with a wavelength less than the green preset wavelength range, and convert the absorbed light into light with a wavelength in the green preset wavelength range.

In some embodiments, as shown in FIG. 2, each green light conversion sub-film 132 is disposed on a light incident side of a corresponding second green filter sub-film 122, that is, each green light conversion sub-films 132 is disposed on a side of a corresponding green filter film 122 proximate to the base substrate 20. In this way, after light is converted by the green light conversion sub-film 132, the second green filter sub-film 122 may filter the converted light, so that when a conversion error occurs and variegated light is generated, the variegated light may be effectively filtered.

In some embodiments, the material of the green light conversion sub-films 132 (i.e., the second light conversion material 112) includes a $CsPbBr_3$ perovskite quantum dot material. In some other embodiments, the material of the green light conversion sub-films 132 (i.e., the second light conversion material 112) includes a $CH_3NH_3PbBr_3$ perovskite quantum dot material. In some other embodiments, the material of the plurality of green light conversion sub-films 132 (i.e., the second light conversion material 112) includes a $CsPbBr_3$ perovskite quantum dot material and a $CH_3NH_3PbBr_3$ perovskite quantum dot material.

In some embodiments, the green preset wavelength range is from 520 nm to 540 nm, that is, the emission peak of the second light conversion material 112 is between 520 nm and 540 nm, and the second light conversion material 112 may absorb light with a wavelength less than 520 nm and convert the absorbed light into light with a wavelength in a range from 520 nm to 540 nm.

In some embodiments, a particle diameter of the second light conversion material 112 is positively related to a wavelength of the converted light. Therefore, the wavelength of the light emitted from the second light conversion material 112 can be adjusted by adjusting the particle diameter of the quantum dot material. For example, the particle diameter of the perovskite quantum dot material is increased to increase the wavelength of the converted light of the second light conversion material 112. For another example, the particle diameter of the perovskite quantum dot material is decreased to reduce the wavelength of the converted light of the second light conversion material 112. For example, in a case where the second light conversion material 112 is a $CH_3NH_3PbBr_3$ perovskite quantum dot material and the particle diameter is 4 nm, the wavelength of the converted light of the second light conversion material 112 is 525 nm.

Each blue light conversion sub-films 133 is disposed on a side of a corresponding second blue filter sub-film 123 proximate to or away from the base substrate 20 (FIG. 2 shows a case where the blue light conversion sub-film 133 is disposed on a side of the second blue filter sub-film 123 proximate to the base substrate 20). Material for manufacturing the blue light conversion sub-films 133 is the third light conversion material 113, and the third light conversion material 113 is configured to absorb light with a wavelength less than the blue preset wavelength range, and convert the absorbed light into light with a wavelength in the blue preset wavelength range.

In some embodiments, as shown in FIG. 2, each blue light conversion sub-film 133 is disposed on a light incident side of a corresponding second blue filter sub-film 123, that is, each blue light conversion sub-films 133 is disposed on a side of a corresponding blue filter film 123 proximate to the base substrate 20. In this way, after light is converted by the blue light conversion sub-film 133, the second blue filter sub-film 123 may filter the converted light, so that when a conversion error occurs and variegated light is generated, the variegated light may be effectively filtered.

In some embodiments, the material of the blue light conversion sub-films 133 (i.e., the third light conversion material 113) includes a $CsPbBr_NCl_{3-N}$ perovskite quantum dot material. In some other embodiments, the material of the blue light conversion sub-films 133 (i.e., the third light conversion material 113) includes a $CH_3NH_3PbBr_NCl_{3-N}$ perovskite quantum dot material. In some other embodiments, the material of the blue light conversion sub-films 133 (i.e., the third light conversion material 113) includes the $CsPbBr_NCl_{3-N}$ perovskite quantum dot material and the $CH_3NH_3PbBr_NCl_{3-N}$ perovskite quantum dot material.

In some embodiments, the blue preset wavelength range is from 450 nm to 470 nm, that is, the emission peak of the third light conversion material 113 is between 450 nm and 470 nm, and the third light conversion material 113 can absorb light with a wavelength less than 450 nm and convert the absorbed light into light with a wavelength in a range from 450 nm to 470 nm.

In some embodiments, a molar mass ratio of Br and Cl in the third light conversion material is positively related to the wavelength of the converted light. That is, the emission wavelength of the third light conversion material 113 can be adjusted by adjusting the molar mass ratio of Br and Cl. For example, the molar mass ratio of Br and Cl is increased to increase the wavelength of the converted light of the third light conversion material 113. For another example, the molar mass ratio of Br and Cl is decreased to reduce the wavelength of the converted light of the third light conversion material 113. For example, in a case where the third light conversion material 113 is a $CH_3NH_3PbBr_NCl_{3-N}$ perovskite quantum dot material, and N=2.4, that is, in a case where the third light conversion material 113 is a $CH_3NH_3PbBr_{2.4}Cl_{0.6}$ perovskite quantum dot material, the wavelength of the converted light of the third light conversion material 113 is 465 nm.

In the above embodiments, N is greater than or equal to 0 and less than 3.

In some examples, a particle diameter of the perovskite quantum dot material is in a range from 2.5 nm to 5 nm.

In some embodiments, referring to FIGS. 1-3, the display substrate 1 further includes a black matrix 14 disposed on the base substrate 20. By setting the black matrix 14, the cross color may be prevented from producing between the adjacent two optical filter films, which improves the display effect.

Figure 7:
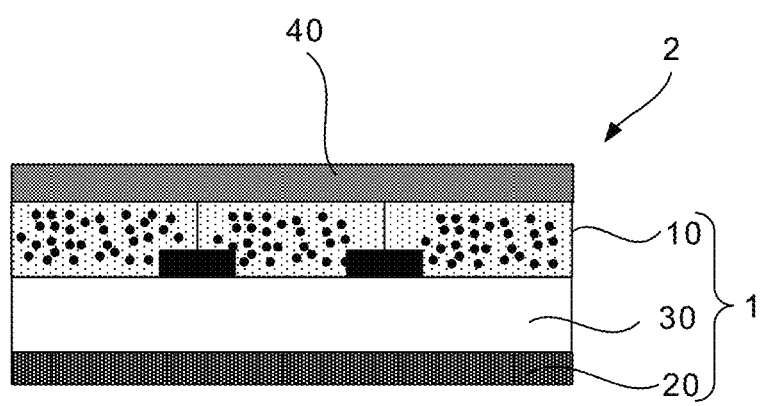
FIG. 7 is a schematic structural diagram of a display apparatus, in accordance with some embodiments.

Referring to FIG. 7, some embodiments of the present disclosure provide a display apparatus 2 including the display substrate 1 in any one of the above embodiments.

In some embodiments, the display apparatus further includes an encapsulation layer 40 disposed on a side of the filter conversion layer 10 away from the base substrate 20, to prevent water oxygen from eroding the filter conversion layer 10 and the WOLED devices 30.

In the above display substrate 1, since the filter conversion layer 10 includes the light conversion material 11, which has a conversion effect from high energy to low energy, the filter conversion layer 10 can absorb light with short wavelengths, and convert it into light with long wavelengths. Therefore, the emission spectrum, which moves toward the short wavelength with the increase of the viewing angle, may be corrected to the position of the emission peak of the front viewing angle as much as possible. In this way, the visual color cast due to the strong microcavity effect is reduced and the display effect of the display substrate is improved.

For example, the display apparatus 2 includes, but is not limited to, a silicon-based display apparatus, such as a silicon-based top emission display apparatus.

The foregoing descriptions are merely some specific implementation manners of the present disclosure, but the protection scope of the present disclosure is not limited thereto. Any person skilled in the art could readily conceive of changes or replacements in the technical scope of the present disclosure, which shall all be included in the protection scope of the present disclosure. Therefore, the protection scope of the present disclosure shall be subject to the protection scope of the claims.

What is claimed is:

1. A display substrate, comprising:
   a base substrate;
   a filter conversion layer disposed on the base substrate, wherein the filter conversion layer includes a light conversion material capable of absorbing light with a wavelength less than a preset wavelength range and converting the absorbed light into light with a wavelength in the preset wavelength range; and
   the filter conversion layer is configured to allow the light with the wavelength in the preset wavelength range to pass through.

2. The display substrate according to claim 1, wherein stokes shift of the light conversion material is less than or equal to 20 nm.

3. The display substrate according to claim 1, wherein the light conversion material includes a perovskite quantum dot material.

4. The display substrate according to claim 3, wherein a general formula of the perovskite quantum dot material is $APbX_3$, wherein A is Cs or $CH_3NH_3$; and $X_3$ is selected from a group consisting of $Br_a$, $Br_NI_{3-N}$ and $Br_NCl_{3-N}$, and N is greater than or equal to 0 and less than 3.

5. The display substrate according to claim 3, wherein a particle diameter of the perovskite quantum dot material is in a range from 2.5 nm to 5 nm.

6. The display substrate according to claim 1, wherein the filter conversion layer further includes an optical filter material configured to allow light with a wavelength in a preset color wavelength range to pass through, and the light conversion material being mixed in the optical filter material.

7. The display substrate according to claim 6, wherein a mass ratio of the light conversion material to the optical filter material is in a range from approximately 2% to approximately 5%.

8. The display substrate according to claim 6, wherein the filter conversion layer includes red filter conversion films, green filter conversion films and blue filter conversion films;
   the preset wavelength range includes a red preset wavelength range, a green preset wavelength range, and a blue preset wavelength range; and
   the light conversion material includes:
   a first light conversion material distributed in the red filter conversion films, wherein the first light conversion material is configured to absorb light with a wavelength less than the red preset wavelength range and convert the absorbed light into light with a wavelength in the red preset wavelength range;
   a second light conversion material distributed in the green filter conversion films, wherein the second light conversion material is configured to absorb light with a wavelength less than the green preset wavelength range and convert the absorbed light into light with a wavelength in the green preset wavelength range; and
   a third light conversion material distributed in the blue filter conversion films, wherein the third light conversion material is configured to absorb light with a wavelength less than the blue preset wavelength range and convert absorbed light into light with a wavelength in the blue preset wavelength range.

9. The display substrate according to claim 8, wherein the red preset wavelength range is from 620 nm to 640 nm, the green preset wavelength range is from 520 nm to 540 nm, and the blue preset wavelength range is from 450 nm to 470 nm.

10. The display substrate according to claim 8, wherein,
the first light conversion material includes a $CsPbBr_NI_{3-N}$ perovskite quantum dot material and/or a $CH_3NH_3PbBr_NI_{3-N}$ perovskite quantum dot material;
the second light conversion material includes a $CsPbBr_3$ perovskite quantum dot material and/or a $CH_3NH_3PbBr_3$ perovskite quantum dot material; and
the third light conversion material includes a $CsPbBr_NCl_{3-N}$ perovskite quantum dot material and/or a $CH_3NH_3PbBr_NCl_{3-N}$ perovskite quantum dot material, wherein
N is greater than or equal to 0 and less than 3.

11. The display substrate according to claim 10, wherein,
a molar mass ratio of Br and I in the first light conversion material is inversely related to a wavelength of converted light of the first light conversion material;
a particle diameter of the second light conversion material is positively related to a wavelength of converted light of the second light conversion material; and
a molar mass ratio of Br and Cl in the third light conversion material is positively related to a wavelength of converted light of the third light conversion material.

12. The display substrate according to claim 1, wherein the filter conversion layer includes:
an optical filter film configured to allow light with a wavelength in a preset color wavelength range to pass through; and
a light conversion film disposed on a side of the optical filter film proximate to or away from the base substrate, wherein material for manufacturing the light conversion film is the light conversion material.

13. The display substrate according to claim 12, wherein a thickness of the light conversion film is in a range from 0.5 μm to 2 μm.

14. The display substrate according to claim 12, wherein the optical filter film includes red filter sub-films, green filter sub-films and blue filter sub-films;
the preset wavelength range includes a red preset wavelength range, a green preset wavelength range, and a blue preset wavelength range;
the light conversion film includes:
red light conversion sub-films each disposed on a side of a corresponding red filter sub-film proximate to or away from the base substrate, wherein material for manufacturing the red light conversion sub-films is a first light conversion material, and the first light conversion material is configured to absorb light with a wavelength less than the red preset wavelength range and convert absorbed light into light with a wavelength in the red preset wavelength range;
green light conversion sub-films each disposed on a side of a corresponding green filter sub-film proximate to or away from the base substrate, wherein material for manufacturing the green light conversion sub-films is a second light conversion material, and the second light conversion material is configured to absorb light with a wavelength less than the green preset wavelength range and convert absorbed light into light with a wavelength in the green preset wavelength range; and
blue light conversion sub-films each disposed on a side of a corresponding blue filter sub-film proximate to or away from the base substrate, wherein material for manufacturing the blue light conversion sub-films is a third light conversion material, and the third light conversion material is configured to absorb light with a wavelength less than the blue preset wavelength range and convert absorbed light into light with a wavelength in the blue preset wavelength range.

15. The display substrate according to claim 14, wherein the red preset wavelength range is from 620 nm to 640 nm, the green preset wavelength range is from 520 nm to 540 nm, and the blue preset wavelength range is from 450 nm to 470 nm.

16. The display substrate according to claim 14, wherein,
the first light conversion material includes a $CsPbBr_NI_{3-N}$ perovskite quantum dot material and/or a $CH_3NH_3PbBr_NI_{3-N}$ perovskite quantum dot material;
the second light conversion material includes a $CsPbBr_3$ perovskite quantum dot material and/or a $CH_3NH_3PbBr_3$ perovskite quantum dot material; and
the third light conversion material includes a $CsPbBr_NCl_{3-N}$ perovskite quantum dot material and/or a $CH_3NH_3PbBr_NCl_{3-N}$ perovskite quantum dot material, wherein
N is greater than or equal to 0 and less than 3.

17. The display substrate according to claim 16, wherein,
a molar mass ratio of Br and I in the first light conversion material is inversely related to a wavelength of converted light of the first light conversion material;
a particle diameter of the second light conversion material is positively related to a wavelength of converted light of the second light conversion material; and
a molar mass ratio of Br and Cl in the third light conversion material is positively related to a wavelength of converted light of the third light conversion material.

18. The display substrate according to claim 1, further comprising white organic light emitting diode (WOLED) devices disposed between the base substrate and the filter conversion layer, wherein
each WOLED device includes an anode, a microcavity adjustment layer, an organic light emitting layer and a cathode.

19. A display apparatus, comprising the display substrate according to claim 1.

* * * * *

UNITED STATES PATENT AND TRADEMARK OFFICE
CERTIFICATE OF CORRECTION

PATENT NO. : 10,978,517 B2
APPLICATION NO. : 16/457876
DATED : April 13, 2021
INVENTOR(S) : Qingchao Zhou et al.

It is certified that error appears in the above-identified patent and that said Letters Patent is hereby corrected as shown below:

In the Specification

Column 5, Line 57, should read:
In some embodiments, the light conversion material 11 includes a perovskite quantum dot material. For example, the general formula of the perovskite quantum dot material is $APbX_3$. Pb is plumbum, A is caesium (Cs) or $CH_3NH_3$, and $X_3$ is selected from a group consisting of $Br_3$, $Br_NI_{3-N}$ and $Br_NCl_{3-N}$. N is greater than or equal to 0 and less than 3. In this way, the light conversion material 11 is allowed to have a conversion effect from high energy to low energy.

Column 9, Line 49, should read:
In some embodiments, the molar mass ratio of Br and I in the first light conversion material 111 is inversely related to a wavelength of the converted light. Therefore, the wavelength of the light emitted from the first light conversion material 111 can be adjusted by adjusting the molar mass ratio of Br and I. For example, the molar mass ratio of Br and I is decreased to increase the wavelength of light emitted from the first light conversion material 111. For another example, the molar mass ratio of Br and I is increased to reduce the wavelength of light emitted from the first light conversion material 111. For example, in a case where the first light conversion material 111 is a $CH_3NH_3PbBr_NI_{3-N}$ perovskite quantum dot material, and N=0.8, that is, in a case where the first light conversion material 111 is $CH_3NH_3PbBr_{0.8}I_{2.2}$, the wavelength of the converted light of the first light conversion material 111 is 628 nm.

Column 11, Line 28, should read:
In some embodiments, a molar mass ratio of Br and Cl in the third light conversion material is positively related to the wavelength of the converted light. That is, the emission wavelength of the third light conversion material 113 can be adjusted by adjusting the molar mass ratio of Br and Cl. For example, the molar mass ratio of Br and Cl is increased to increase the wavelength of the converted light of the third light conversion material 113. For another example, the molar mass ratio of Br and Cl is decreased to reduce the wavelength of the converted light of the third light conversion material 113. For example, in a case where the third light conversion material 113 is a $CH_3NH_3PbBr_NCl_{3-N}$ perovskite quantum dot material, and N=2.4, that is, in a case where the third light conversion material Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*

113 is a $CH_3NH_3PbBr_{2.4}Cl_{0.6}$ perovskite quantum dot material, the wavelength of the converted light of the third light conversion material 113 is 465 nm.

In the Claims

Column 12, Line 23, Claim 4, should read:
The display substrate according to claim 3, wherein a general formula of the perovskite quantum dot material is $APbX_3$, wherein A is Cs or $CH_3NH_3$; and $X_3$ is selected from a group consisting of $Br_3$, $Br_NI_{3-N}$ and $Br_NCl_{3-N}$, and N is greater than or equal to 0 and less than 3.